United States Patent
Yamazawa et al.

(10) Patent No.: US 8,647,442 B2
(45) Date of Patent: Feb. 11, 2014

(54) CLEANING SUBSTRATE AND CLEANING METHOD

(75) Inventors: Yohei Yamazawa, Nirasaki (JP); Hiroshi Nagaike, Nirasaki (JP); Masashi Saito, Nirasaki (JP); Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/454,695

(22) Filed: Apr. 24, 2012

(65) Prior Publication Data

US 2012/0204904 A1 Aug. 16, 2012

Related U.S. Application Data

(62) Division of application No. 12/408,888, filed on Mar. 23, 2009, now abandoned.

(60) Provisional application No. 61/050,772, filed on May 6, 2008.

(30) Foreign Application Priority Data

Mar. 27, 2008 (JP) ................................. 2008-083045

(51) Int. Cl.
 *B08B 9/08* (2006.01)
 *B08B 1/00* (2006.01)
(52) U.S. Cl.
 USPC ................ 134/22.1; 134/8; 134/19; 438/905

(58) Field of Classification Search
 USPC ................................ 134/8, 19, 22.1; 438/905
 See application file for complete search history.

(56) References Cited

U.S. PATENT DOCUMENTS

| | | | |
|---|---|---|---|
| 6,079,426 A | 6/2000 | Sugrahmanyam et al. | |
| 6,630,411 B1 * | 10/2003 | Broyles et al. | 438/778 |
| 2005/0258578 A1 | 11/2005 | Birnbaum et al. | |
| 2007/0251569 A1 * | 11/2007 | Shan et al. | 136/246 |

FOREIGN PATENT DOCUMENTS

| | | |
|---|---|---|
| JP | U-05-96057 | 12/1993 |
| JP | A-06-252066 | 9/1994 |
| JP | 6-299349 | 10/1994 |
| JP | 2004-63669 | 2/2004 |
| JP | 2007-92380 | 4/2007 |
| WO | WO 2008030501 A2 * | 3/2008 |

OTHER PUBLICATIONS

Office Action mailed Feb. 3, 2012, in co-pending U.S. Appl. No. 12/408,888.

\* cited by examiner

*Primary Examiner* — Michael Kornakov
*Assistant Examiner* — Natasha Campbell
(74) *Attorney, Agent, or Firm* — Oblon, Spivak, McClelland, Maier & Neustadt, L.L.P.

(57) ABSTRACT

A cleaning substrate that can prevent a decrease in the operating rate of a substrate processing apparatus. The cleaning substrate that cleans the interior of a chamber in the substrate processing apparatus has a removal mechanism that removes foreign matter in the chamber.

4 Claims, 12 Drawing Sheets

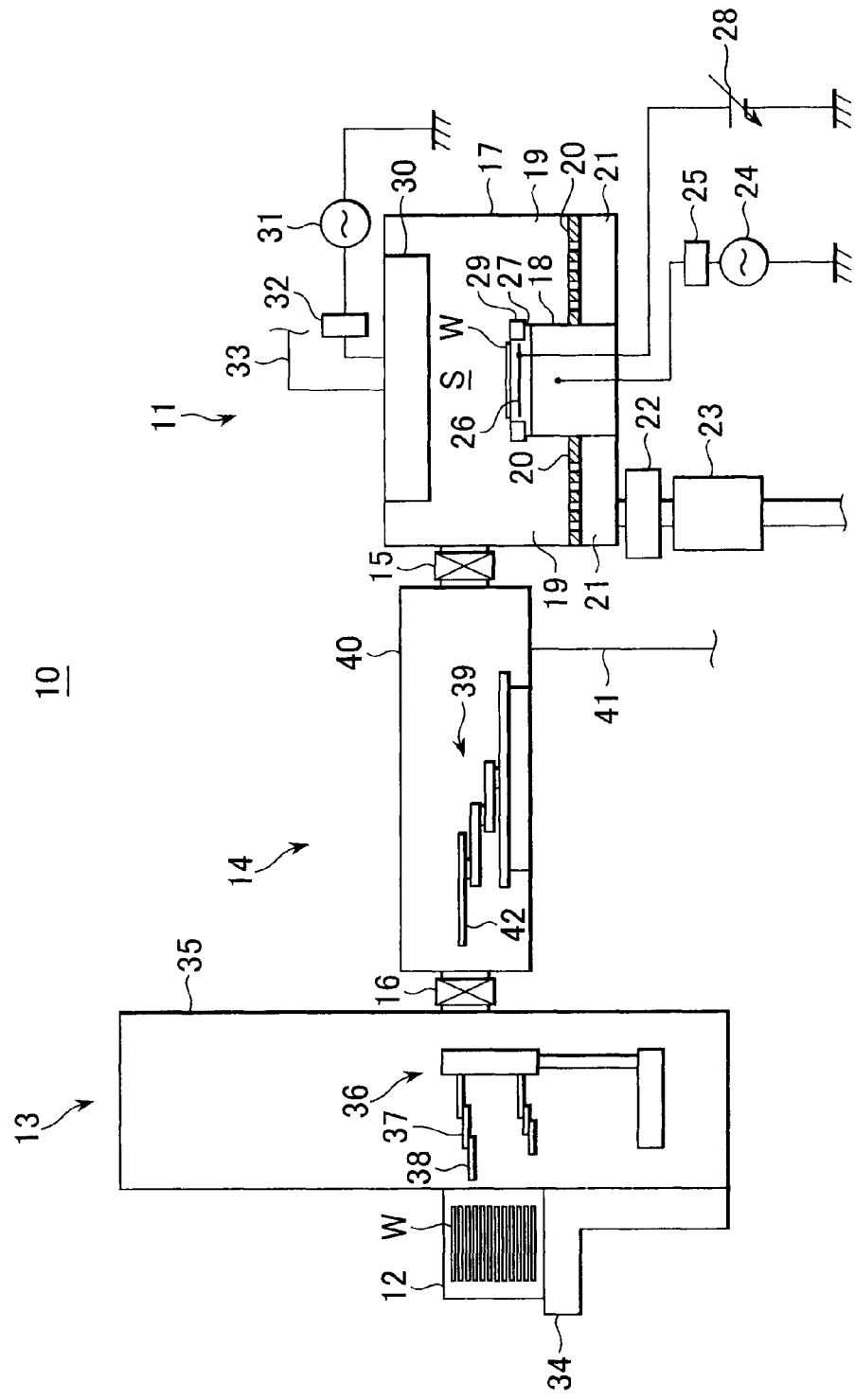

CLEANING SUBSTRATE AND CLEANING METHOD

CROSS REFERENCE TO RELATED APPLICATIONS

This application is a divisional application of U.S. application Ser. No. 12/408,888, filed Mar. 23, 2009, which claims the benefit of U.S. provisional application No. 61/050,772, filed May 6, 2008. U.S. application Ser. No. 12/408,888 claims priority to JP 2008-083045 filed Mar. 27, 2008. The entire content of U.S. application Ser. No. 12/408,888 is incorporated herein by reference.

BACKGROUND OF THE INVENTION

1. Field of the Invention

The present invention relates to a cleaning substrate and a cleaning method, and in particular relates to a cleaning substrate that cleans the interior of a processing chamber in a substrate processing apparatus and a cleaning method using the cleaning substrate.

2. Description of the Related Art

A substrate processing apparatus, for example, a plasma processing apparatus has a processing chamber (chamber) in which a wafer as a substrate is accommodated, and a process gas is supplied into the chamber to subject the wafer to plasma processing, for example, etching processing. In the chamber, when plasma processing is carried out, reaction product arising from the reaction of the process gas is produced, and part of the reaction product floats as particles (foreign matter). If the floating particles become attached to a surface of a wafer, short-circuiting of wiring will occur in a product manufactured from the wafer, resulting in decreasing the yield of semiconductor devices ultimately manufactured.

Moreover, if the plasma processing is repeatedly carried out in the chamber, deposit becomes attached to a wall of the chamber and surfaces of component parts. The deposit cannot be completely removed by dry cleaning, and is thus removed by carrying out wet cleaning on a regular basis. In the wet cleaning, the chamber is opened to the atmosphere. When the chamber is opened to the atmosphere, moisture in the atmosphere becomes attached to the wall of the chamber and the surfaces of component parts. The moisture (foreign matter) attached to the wall of the chamber and the surfaces of component parts gradually evaporates and diffuses into the chamber and thus adversely affects the plasma processing.

Conventionally, to remove such foreign matter (particles and moisture) from the chamber, maintenance of the chamber such as evacuation of the chamber using an exhaust system that exhausts gas inside the chamber is carried out (see, for example, the specification of Japanese Patent Application No. 2007-092380).

However, because the interior of the chamber in the substrate processing apparatus is required to be cleaned to a high level, the above described maintenance has to be carried out for a long time period. For this reason, there is the problem that the operation of the substrate processing apparatus has to be stopped for a long time period, resulting in the operating rate of the substrate processing apparatus decreasing.

SUMMARY OF THE INVENTION

The present invention provides a cleaning substrate and a cleaning method that can prevent a decrease in the operating rate of a substrate processing apparatus.

Accordingly, in a first aspect of the present invention, there is provided a cleaning substrate that cleans an interior of a processing chamber in a substrate processing apparatus, comprising a removal mechanism that removes foreign matter in the processing chamber.

According to the first aspect of the present invention, the cleaning substrate is comprised of the removal mechanism that removes foreign matter in the processing chamber. When foreign matter is to be removed from the processing chamber, maintenance of the processing chamber such as evacuation of the interior of the processing chamber is carried out. When the cleaning substrate having the removal mechanism is transferred into the processing chamber, and then evacuation is carried out, foreign matter in the processing chamber is removed by the cleaning substrate as well. Thus, the interior of the processing chamber can be easily cleaned to a desired level, and hence the time period required for maintenance can be shortened. As a result, the time period for which the operation of the substrate processing apparatus is stopped can be shortened, and hence a decrease in the operating rate of the substrate processing apparatus can be prevented.

The first aspect of the present invention can provide a cleaning substrate, wherein the removal mechanism comprises a particle capturing material that captures particles.

According to the first aspect of the present invention, the removal mechanism is comprised of the particle capturing material. When particles as foreign matter are to be removed from the processing chamber, maintenance of the processing chamber such as evacuation of the interior of the processing chamber is carried out. When the cleaning substrate having the particle capturing material is transferred into the processing chamber, and then evacuation is carried out, particles that have entered the particle capturing material are captured by the particle capturing material and removed from the processing chamber. Thus, particles in the processing chamber can be efficiently removed.

The first aspect of the present invention can provide a cleaning substrate, wherein the removal mechanism comprises a moisture absorbing material that absorbs moisture.

According to the first aspect of the present invention, the removal mechanism is comprised of the moisture absorbing material. When moisture as foreign matter is to be removed from the processing chamber, maintenance of the processing chamber such as evacuation of the interior of the processing chamber is carried out. When the cleaning substrate having the moisture absorbing material is transferred into the processing chamber, and then evacuation is carried out, moisture in the processing chamber is absorbed by the moisture absorbing material and removed from the processing chamber. Thus, moisture in the processing chamber can be efficiently removed.

The first aspect of the present invention can provide a cleaning substrate, wherein the moisture absorbing material is covered with a waterproofing film.

According to the first aspect of the present invention, the moisture absorbing material is covered with the waterproofing film. The moisture absorbing material can be prevented from absorbing moisture in the path through which the cleaning substrate is transferred into the processing chamber.

The first aspect of the present invention can provide a cleaning substrate, wherein the removal mechanism comprises a bag that entirely covers a cleaning agent that cleans deposit in the processing chamber, and a base material that supports the bag thereon, and in which a plurality of through holes for transferring pressure of gas supplied into a gap between the cleaning substrate and a mounting stage disposed in the processing chamber when the cleaning substrate is mounted on the mounting stage.

According to the first aspect of the present invention, the removal mechanism is comprised of the bag that entirely covers the cleaning agent that cleans deposit in the processing chamber, and the base material that supports the bag thereon, and in which the plurality of through holes for transferring the pressure of the gas supplied into the gap between the cleaning substrate and a mounting stage disposed in the processing chamber when the cleaning substrate is mounted on the mounting stage. When the gas is supplied at high pressure into the gap between the cleaning substrate and the mounting stage after the cleaning substrate is mounted on the mounting stage, the pressure of the gas is transferred to the bag via the plurality of through holes formed in the base material, whereby the bag tears. When the bag tears, the cleaning agent in the bag scatters into the processing chamber and becomes attached to deposit in the processing chamber. The cleaning agent attached to the deposit cleans the deposit, and hence the number of times of wet cleaning carried out in the processing chamber on a regular basis can be reduced. Further, particles arising from deposit in the processing chamber can be reduced, and hence the time period required for maintenance can be more shortened.

The first aspect of the present invention can provide a cleaning substrate, wherein the removal mechanism comprises a bag that entirely covers a cleaning agent that cleans deposit in the processing chamber, a base material that supports the bag thereon, and a metallic thin film that is provided as a top covering on the bag.

According to the first aspect of the present invention, the removal mechanism is comprised of the bag that entirely covers the cleaning agent that cleans deposit in the processing chamber, the base material that supports the bag thereon, and the metallic thin film that is provided as a top covering on the bag. Upon a DC voltage being supplied to an electrode plate inside the mounting stage after the cleaning substrate is mounted on the mounting stage, the metallic thin film becomes charged, and static electricity is produced between the metallic thin film and the electrode plate, and the bag interposed between the metallic thin film and the mounting stage tears due to pressure arising from the static electricity. When the bag tears, the cleaning agent in the bag scatters into the processing chamber, and hence the same effects as those obtained by the above described cleaning substrate can be obtained.

The first aspect of the present invention can provide a cleaning substrate, wherein the removal mechanism comprises a base material of which surface is coated with a volatile cleaning agent that cleans deposit in the processing chamber, and a resin film that covers the surface of the base material.

According to the first aspect of the present invention, the removal mechanism is comprised of the base material of which surface is coated with the volatile cleaning agent that cleans deposit in the processing chamber, and the resin film that covers the surface of the base material. When plasma is produced in the processing chamber after the cleaning substrate is transferred into the processing chamber, the resin film tears due to etching. When the resin film tears, the cleaning agent coated on the base material volatilizes and scatters into the processing chamber, and hence the same effects as those obtained by the above described cleaning substrate can be obtained.

Accordingly, in a second aspect of the present invention, there is provided a method of cleaning an interior of a processing chamber in a substrate processing apparatus, comprising a transferring-in step of transferring a cleaning substrate comprising a particle capturing material that captures particles into the processing chamber, a discharging step of evacuating an interior of the processing chamber to discharge particles in the processing chamber, and a transferring-out step of transferring the cleaning substrate out from the processing chamber.

According to the second aspect of the present invention, after the cleaning substrate having the particle capturing material is transferred into the processing chamber, the interior of the processing chamber is evacuated to discharge particles. At this time, particles that have entered the particle capturing material are captured by the particle capturing material and removed from the processing chamber. Thus, particles in the processing chamber can be efficiently removed. Therefore, the interior of the processing chamber can be easily cleaned to a desired level, and hence the time period required for maintenance can be shortened. As a result, the time period for which the operation of the substrate processing apparatus is stopped can be shortened, and hence a decrease in the operating rate of the substrate processing apparatus can be prevented.

The second aspect of the present invention can provide a cleaning method, wherein in the discharging step, scattering of the particles is promoted in the processing chamber.

According to the second aspect of the present invention, scattering of the particles is promoted in the processing chamber. When scattering of the particles is promoted in the processing chamber, the chances for the particles to be captured by the particle capturing material are increased, and hence the particles in the processing chamber can be quickly removed.

The second aspect of the present invention can provide a cleaning method comprising a removing step of removing particles captured by the particle capturing material of the transferred-out cleaning substrate.

According to the third aspect of the present invention, particles captured by the particle capturing material of the transferred-out cleaning substrate are removed. That is, the cleaning substrate is accommodated again in a substantially new condition in an accommodating case. Thus, the cleaning substrate can be easily reused.

Accordingly, in a third aspect of the present invention, there is provided a method of cleaning an interior of a processing chamber in a substrate processing apparatus, comprising a transferring-in step of transferring a cleaning substrate comprising a moisture absorbing material that absorbs moisture into the processing chamber in a state with the cleaning substrate being at a high temperature, a temperature adjusting step of cooling the transferred-in cleaning substrate and heating the processing chamber, and a transferring-out step of transferring the cleaning substrate out from the processing chamber.

According to the third aspect of the present invention, after the cleaning substrate having the moisture absorbing material that absorbs moisture is transferred at high temperature into the processing chamber, the cleaning substrate is cooled, and the processing chamber is heated. Because the cleaning substrate is transferred at high temperature into the processing chamber, absorption of moisture by the moisture absorbing material in the path through which the cleaning substrate is transferred into the processing chamber can be prevented. Because moisture tends to collect in a low-temperature member, absorption of moisture to the moisture absorbing material of the cleaning substrate transferred into the processing chamber is promoted, and moisture in the processing chamber can be efficiently removed. Therefore, the interior of the processing chamber can be easily cleaned to a desired level, and hence the same effects as those obtained by the above described cleaning substrate can be obtained.

Accordingly, in a fourth aspect of the present invention, there is provided a method of cleaning an interior of a processing chamber in a substrate processing apparatus, comprising a transferring-in step of transferring a cleaning substrate comprising a moisture absorbing material that is covered with a waterproofing film and absorbs moisture into the processing chamber, an etching step of etching the waterproofing film of the transferred-in cleaning substrate; a temperature adjusting step of cooling the cleaning substrate and heating the processing chamber, and a transferring-out step of transferring the cleaning substrate out from the processing chamber.

According to the fourth aspect of the present invention, after the cleaning substrate having the moisture absorbing material that is covered with the waterproofing film and absorbs moisture into the processing chamber, and the waterproofing film of the cleaning substrate is etched, the cleaning substrate is cooled, and the processing chamber is heated. Because the cleaning substrate is transferred into the processing chamber with the moisture absorbing material covered with the waterproofing film, the water absorbing material can be prevented from absorbing moisture in the path through which the cleaning substrate is transferred into the processing chamber. Because moisture tends to collect in a low-temperature member, absorption of moisture to the moisture absorbing material of the cleaning substrate transferred into the processing chamber is promoted, and moisture in the processing chamber can be efficiently removed. Therefore, the same effects as those obtained by the above described cleaning method can be obtained.

The fourth aspect of the present invention can provide a cleaning method comprising a removing step of removing moisture absorbed by the moisture absorbing material of the transferred-out cleaning substrate.

According to the fourth aspect of the present invention, moisture absorbed by the moisture absorbing material is removed. That is, the cleaning substrate is accommodated again in a substantially new condition in the accommodating case. Thus, the cleaning substrate can be easily reused.

Accordingly, in a fifth aspect of the present invention, there is provided a method of cleaning an interior of a processing chamber in a substrate processing apparatus that comprises a processing chamber in which a substrate is accommodated, a mounting stage that is disposed in the processing chamber and on which the substrate is mounted, and a plurality of gas supply holes opened to an upper surface of the mounting stage, comprising a mounting step of transferring a cleaning substrate comprising a bag that entirely covers a cleaning agent that cleans deposit in the processing chamber, and a base material that supports the bag thereon, and in which a plurality of through holes are formed into the processing chamber and mounting the cleaning substrate on the mounting stage a high-pressure supplying step of supplying gas at high pressure into a gap between the cleaning substrate and the mounting stage; and a transferring-out step of transferring the cleaning substrate out from the processing chamber.

According to the fifth aspect of the present invention, the cleaning substrate having the bag that entirely covers the cleaning agent that cleans deposit in the processing chamber, and the base material that supports the bag thereon, and in which the plurality of through holes are formed is transferred into the processing chamber and mounted on the mounting stage, and then gas is supplied at high pressure into the gap between the cleaning substrate and the mounting stage. At this time, the pressure of the gas is transferred to the bag via the plurality of through holes formed in the base material, whereby the bag tears. When the bag tears, the cleaning agent in the bag scatters into the processing chamber and becomes attached to deposit in the processing chamber. The cleaning agent attached to the deposit cleans the deposit, and hence the number of times of wet cleaning carried out in the processing chamber on a regular basis can be decreased. Further, particles arising from deposit in the processing chamber can be reduced, and hence the time period required for maintenance can be more shortened. Thus, the same effects as those obtained by the above described cleaning method can be obtained.

The fifth aspect of the present invention can provide a cleaning method comprising another mounting step of transferring another cleaning substrate comprising a bag that entirely covers a neutralizing agent that neutralizes the cleaning agent, and a base material that supports the bag thereon, and in which a plurality of through holes are formed into the processing chamber and mounting the cleaning substrate on the mounting stage another high-pressure supplying step of supplying gas at high pressure into a the gap between the cleaning substrate and the mounting stage, and another transferring-out step of transferring the other cleaning substrate out from the processing chamber.

According to the fifth aspect of the present invention, the cleaning substrate having the bag that entirely covers the neutralizing agent that neutralizes the cleaning agent, and the base material in which the plurality of through holes are formed is transferred into the processing chamber and mounted on the mounting stage, and then gas is supplied at high pressure into the gap between the cleaning substrate and the mounting stage. At this time, the pressure of the gas is transferred to the bag via the plurality of through holes formed in the base material, whereby the bag tears. When the bag tears, the neutralizing agent in the bag scatters into the processing chamber and becomes attached to the cleaning agent remaining in the processing chamber. The cleaning agent attached to the cleaning agent neutralizes the cleaning agent, and hence deposit in the processing chamber can be safely cleaned.

Accordingly, in a sixth aspect of the present invention, there is provided a method of cleaning an interior of a processing chamber in a substrate processing apparatus that comprises a processing chamber in which a substrate is accommodated, and a mounting stage that is disposed in the processing chamber and on which the substrate is mounted, the mounting stage having therein an electrode plate connected to a DC power source, comprising a mounting step of transferring a cleaning substrate comprising a bag that entirely covers a cleaning agent that cleans deposit in the processing chamber, and a base material that supports the bag thereon, and a metallic thin film that is provided as a top covering on the bag into the processing chamber and mounting the cleaning substrate on the mounting stage, an applying step of applying a DC voltage to the electrode plate, and a transferring-out step of transferring the cleaning substrate out from the processing chamber.

According to the sixth aspect of the present invention, the cleaning substrate having the bag that entirely covers the cleaning agent that cleans deposit in the processing chamber, the base material that supports a bag thereon, and the metallic thin film that is provided as a top covering on the bag is transferred into the processing chamber and mounted on the mounting stage, and then a DC voltage is applied to the electrode plate inside the mounting stage. At this time, the metallic thin film becomes charged, and static electricity is produced between the metallic thin film and the electrode plate, and the bag interposed between the metallic thin film and the mounting stage tears due to pressure arising from the static electricity. When the bag tears, the cleaning agent in the bag scatters into the processing chamber, and hence the same effects as those obtained by the above described cleaning method can be obtained.

Accordingly, in a seventh aspect of the present invention, there is provided a method of cleaning an interior of a processing chamber in a substrate processing apparatus, comprising a transferring-in step of transferring a cleaning substrate comprising a base material of which surface is coated with a volatile cleaning agent that cleans deposit in the processing chamber, and a resin film that covers the surface of the base material into the processing chamber a producing step of producing plasma in the processing chamber, and a transferring-out step of transferring the cleaning substrate out from the processing chamber.

According to the seventh aspect of the present invention, the cleaning substrate having the base material of which surface is coated with the volatile cleaning agent that cleans deposit in the processing chamber, and the resin film that covers the surface of the base material is transferred into the processing chamber, and then plasma is produced in the processing chamber. At this time, the resin film tears due to etching. When the resin film tears, the cleaning agent coated on the base material volatilizes, and hence the same effects as those obtained by the above described cleaning method can be obtained.

The features and advantages of the invention will become more apparent from the following detailed description taken in conjunction with the accompanying drawings.

BRIEF DESCRIPTION OF THE DRAWINGS

FIG. 1 is a cross-sectional view schematically showing the construction of a substrate processing system to which a cleaning method according to an embodiment of the present invention is applied;

FIGS. 3A an 3B are cross-sectional views schematically showing the cross-sectional structure of a cleaning substrate used in the cleaning process as the cleaning method according to the present embodiment, in which FIG. 3A shows the case that a nonwoven cloth is provided on a silicon base material.

FIGS. 7A an 7B are cross-sectional views schematically showing the cross-sectional structure of the cleaning substrate used in the first variation of the cleaning process as the cleaning method according to the present embodiment, in which FIG. 7A shows the case that the porous ceramic is provided on a silicon base material.

FIGS. 12A, 12B, and 12C are cross-sectional views schematically showing the cross-sectional structure of the cleaning substrate used in the second variation of the cleaning process as the cleaning method according to the present embodiment, in which FIG. 12A shows the case that the bag that entirely covers a cleaning agent is provided on a silicon base material in which through holes are formed, FIG. 12B shows the case that the bag that entirely covers the cleaning agent is provided on the silicon base material, and a metallic thin film is provided on the bag, and FIG. 12C shows the case that a cleaning agent is coated on the silicon base material, and the cleaning agent is covered with a resin film.

DETAILED DESCRIPTION OF PREFERRED EMBODIMENTS

Figure 2A:
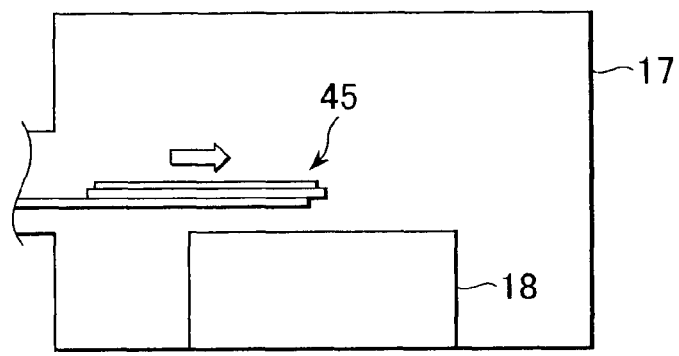
FIGS. 2A, 2B, and 2C are process drawings showing a cleaning process as the cleaning method according to the present embodiment.

The present invention will now be described in detail with reference to the drawings showing a preferred embodiment thereof.

First, a description will be given of a substrate processing system to which a cleaning method according to an embodiment of the present invention is applied.

FIG. 1 is a cross-sectional view schematically showing the construction of the substrate processing system to which the cleaning method according to the present embodiment is applied.

Referring to FIG. 1, the substrate processing system 10 is comprised of a process module 11 that subjects each of semiconductor wafers (hereinafter referred to merely as "wafers") W as substrates to various kinds of plasma processing such as film formation processing, diffusion processing, and etching processing, a loader module 13 that removes each wafer W from a FOUP (Front Opening Unified Pod) 12 in which a predetermined number of wafers W are accommodated, and a load-lock module 14 that is disposed between the loader module 13 and the process module 11 and is for transferring each wafer W from the loader module 13 into the process module 11 and from the process module 11 into the loader module 13.

Moreover, the process module 11 and the load-lock module 14 are connected together via a gate valve 15, and the load-lock module 14 and the loader module 13 are connected together via a gate valve 16.

The process module 11 has a cylindrical chamber 17 made of metal such as aluminum or stainless steel, and a cylindrical susceptor 18 on which is mounted a wafer W having a diameter of, for example, 300 mm is disposed in the chamber 17.

An exhaust path 19 that acts as a flow path through which gas in a processing space S, described later, is exhausted out of the chamber 17 is formed between the side wall of the chamber 17 and the susceptor 18. An annular exhaust plate 20 is disposed part way along the exhaust path 19. A manifold 21 that is a space downstream of the exhaust plate 20 in the exhaust path 19 communicates with an automatic pressure control valve (Adaptive Pressure Control Valve) (hereinafter referred to as the "APC valve") 22, which is a variable butterfly valve. The APC valve 22 is connected to a turbo-molecular pump (hereinafter referred to as the "TMP") 23, which is an exhausting pump for evacuation. The exhaust plate 20 prevents plasma produced in the processing space S from leaking into the manifold 21. The APC valve 22 controls the pressure in the chamber 17, and the TMP 23 reduces the pressure in the chamber 17 down to a substantially vacuum state. The exhaust path 19, exhaust plate 20, manifold 21, APC valve 22, and TMP 23 constitute an exhaust system.

A radio frequency power source 24 is connected to the susceptor 18 via a matcher 25, and supplies radio frequency electrical power to the susceptor 18. The susceptor 18 thus acts as a lower electrode. The matcher 25 reduces reflection of the radio frequency electrical power from the susceptor 18 so as to maximize the efficiency of the supply of the radio frequency electrical power into the susceptor 18.

An electrostatic chuck 27 having an electrostatic electrode plate 26 therein is provided in an upper portion of the susceptor 18. A DC power source 28 is electrically connected to the electrostatic electrode plate 26. Upon a positive DC voltage being applied to the electrostatic electrode plate 26, a negative potential is produced on a surface of the wafer W which faces the electrostatic chuck 27 (hereinafter referred to as "the rear surface of the wafer W"). A potential difference thus arises between the electrostatic electrode plate 26 and the rear surface of the wafer W, and hence the wafer W is attracted to and held on the electrostatic chuck 27 through a Coulomb force or a Johnsen-Rahbek force due to the potential difference. Moreover, an annular focus ring 29 is mounted on the electrostatic chuck 27 such as to surround the attracted and held wafer W. The focus ring 29 focuses plasma produced in the processing space S between the susceptor 18 and a showerhead 30, described later, toward the wafer W.

An annular coolant chamber (not shown) is provided inside the susceptor 18. A coolant, for example, cooling water at a predetermined temperature is circulated through the coolant chamber, and a processing temperature of the wafer W on the susceptor 18 is controlled through the temperature of the coolant. It should be noted that helium gas is supplied into a gap between the wafer W and the susceptor 18, and the helium gas transfers heat from the wafer W to the susceptor 18.

The showerhead 30 that is disk-shaped is disposed in a ceiling portion of the chamber 17. A radio frequency power source 31 is connected to the showerhead 30 via a matcher 32. The radio frequency power source 31 supplies radio frequency electrical power to showerhead 30. The showerhead 30 thus acts as an upper electrode. It should be noted that the matcher 32 has the same function as the function of the matcher 25.

A process gas introducing pipe 33 that supplies a process gas is connected to the showerhead 30, and the showerhead 30 introduces the process gas supplied from the process gas introducing pipe 33 into the processing space S.

In the processing space S in the chamber 17 of the process module 11, the susceptor 18 and the showerhead 30 supplied with radio frequency electrical applies radio frequency electrical power into the processing space S, whereby the process gas is turned into high-density plasma in the processing space S. The produced plasma is focused onto a front surface of the wafer W by the focus ring 29, and, for example, physically/chemically etches the front surface of the wafer W.

The loader module 13 has a FOUP mounting stage on which the FOUP 12 is mounted, and a transfer chamber 35.

The FOUP 12 accommodates, for example, 25 wafers W, which are mounted in a plurality of tiers at equal pitch. The transfer chamber 35 has a rectangular parallelepiped box shape, and has therein a SCARA-type transfer arm 36 for transferring the wafers W.

The transfer arm 36 has an articulated transfer arm arm portion 37 which is constructed such as to be able to bend and extend, and a pick 38 attached to a distal end of the transfer arm arm portion 37. The pick 38 is constructed such that a wafer W is mounted directly thereon. Moreover, the transfer arm 36 is constructed such as to freely turn, and can be freely bent via the transfer arm arm portion 37, and hence a wafer W mounted on the pick 38 can be freely transferred between the FOUP 12 and the load-lock module 14.

The load-lock module 14 has a chamber 40 in which is disposed a transfer arm 39 that can bend, extend and turn, and a load-lock module exhaust system 41 that evacuates the interior of the chamber 40. The transfer arm 39 is a SCARA-type transfer arm comprised of a plurality of arm portions, and has a pick 42 attached to a distal end thereof. The pick 42 is constructed such that a wafer W is mounted directly thereon.

When a wafer W is to be transferred from the loader module 13 to the process module, once the gate valve 16 has been opened, the transfer arm 39 receives the wafer W from the transfer arm 36 in the transfer chamber 35 at atmospheric pressure, and once the gate valve 16 has been closed to evacuate the interior of the chamber 40 to a predetermined pressure, and then the gate valve 15 has been opened, the transfer arm 39 enters the chamber 17 of the process module 11, and mounts the wafer W on the susceptor 18. Moreover, when the wafer W is to be transferred from the process module 11 to the loader module 13, once the gate valve 15 has been opened, the transfer arm 39 enters the chamber 17 of the process module 11 and receives the wafer W from the susceptor 18, and once the gate valve 15 has been closed to return the pressure in the chamber 40 to atmospheric pressure, and then the gate valve 16 has been opened, the transfer arm 39 passes the wafer W to the transfer arm 36 in the transfer chamber 35.

It should be noted that operation of the component elements of the process module 11, loader module 13, and load-lock module 14 constituting the substrate processing system 10 is controlled by a computer (not shown) as a controller of the substrate processing system 10, an external server (not shown) as a controller connected to the substrate processing system 10, or the like.

In the chamber 17 of the process module 11, because the plasma processing is carried out, reaction product arising from the reaction of a process gas is produced, and part of the reaction product floats as particles (foreign matter) in the chamber 17 and becomes attached to a wall of the chamber 17 and surfaces of component parts of the chamber 17 (hereinafter referred to as the "wall of the chamber 17 and so on"). Moreover, in the chamber 17, because the plasma processing is repeatedly carried out, deposit becomes attached to the wall of the chamber 17 and so on. The deposit has to be removed by carrying out wet cleaning on a regular basis, and hence the chamber 17 is opened to the atmosphere at the time of wet cleaning. At this time, moisture (foreign matter) in the atmosphere becomes attached to the wall of the chamber 17 and so on.

The substrate processing system 10 in the present embodiment carries out a cleaning process as the cleaning method, described later, and removes the foreign matter (particles and moisture) from the interior of the chamber 17.

A description will now be given of the cleaning method according to the embodiment of the present invention.

Figure 2B:
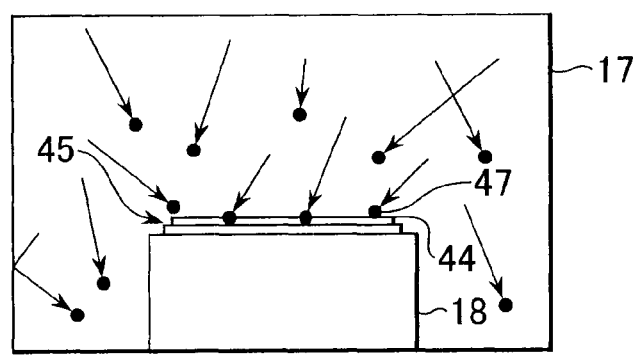
Figure 2C:
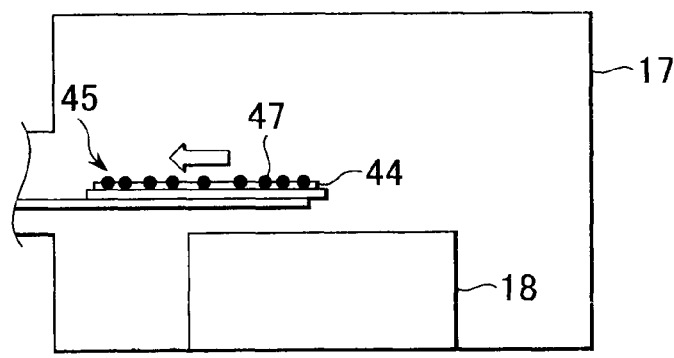

FIGS. 2A, 2B, and 2C are process drawings showing the cleaning process as the cleaning method according to the present embodiment. It should be noted that the present process is carried out upon start-up of the substrate processing system 10, between plasma processing on a certain production lot comprised of a predetermined number of wafers W and the subsequent plasma processing on another production lot, after modification of the substrate processing system 10, and so on.

Figure 3A:
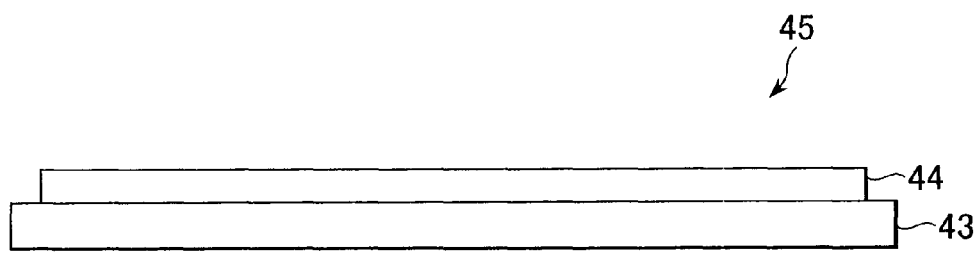
Figure 4:
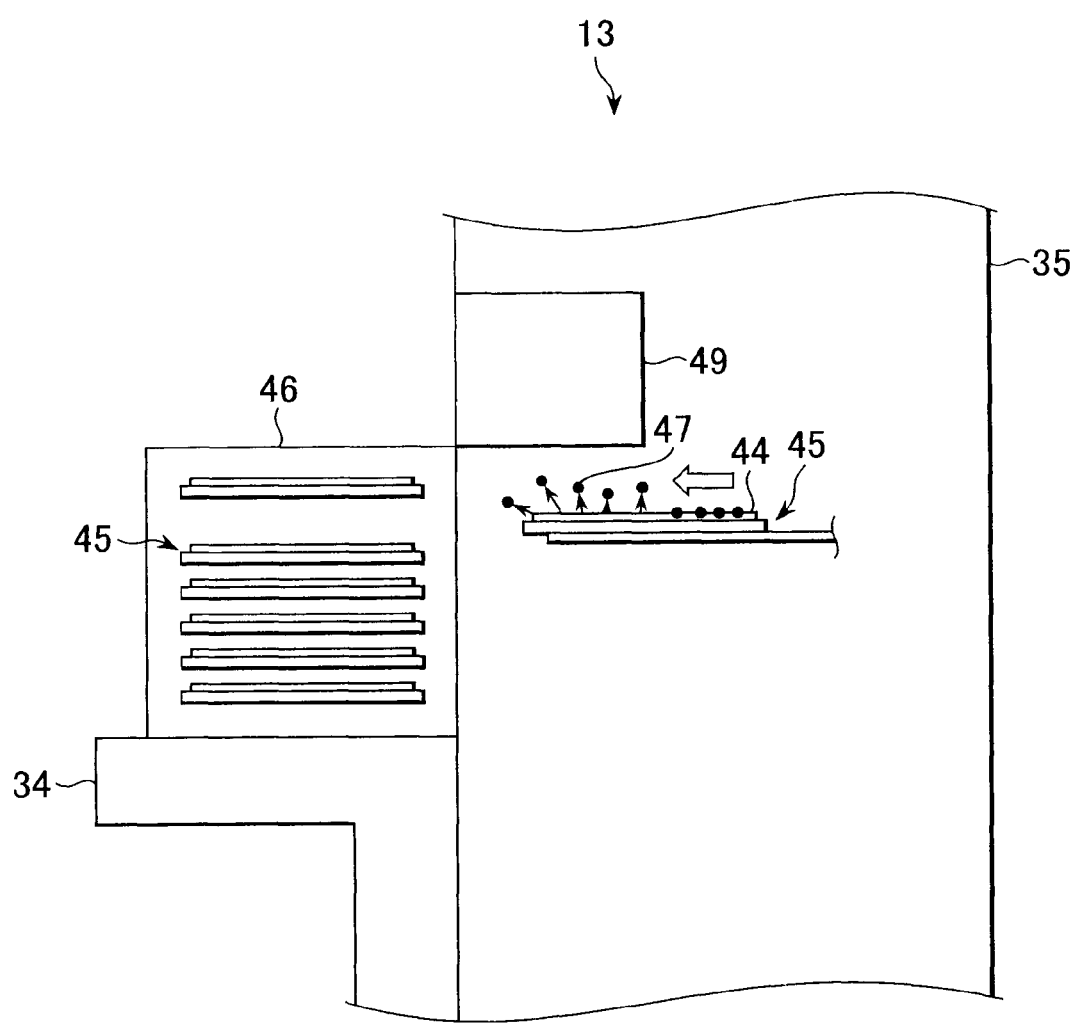
FIG. 4 is a view useful in explaining how particles captured onto the cleaning substrate are removed by a particle removal unit.

First, before the cleaning process in FIGS. 2A, 2B, and 2C is carried out, cleaning substrates 45 each of which has a disk-shaped silicon base material 43, and a nonwoven cloth 44 (particle capturing material) provided on the silicon base material 43 as shown in FIG. 3A are prepared. Then, as shown in FIG. 4, a cleaning FOUP 46 in which a plurality of cleaning substrates 45 are accommodated is mounted in place of the FOUP 12 on the FOUP mounting stage 34.

Next, as in the case that a wafer W is transferred into the chamber 17 of the process module 11, the cleaning substrate 45 is transferred into the chamber 17 and mounted on the susceptor 18 (FIG. 2A).

Next, the above described exhaust system evacuates the interior of the chamber 17. Then, particles attached to the wall of the chamber 17 and so on are separated. Specifically, the particles are separated through thermal stress arising from temperature changes of the wall of the chamber 17 and so on, viscous force of a large amount of gas introduced into the chamber 17, impact force of a gas impact wave produced when a large amount of gas is introduced into the chamber 17 in a high vacuum state, vibrations occurring when the process module 11 is driven, or vibrations from outside, e.g. vibrations added by an ultrasonic vibrator connected to the chamber 17. At this time, the particles floating in the chamber 17 and the particles separated from the wall of the chamber 7 and so on scatter in the chamber 17, and part of the particles as well as gas in the chamber 17 is discharged from the chamber 17 while repeatedly colliding with the wall of the chamber 17 and so on. Moreover, part of the scattering particles enters the nonwoven cloth 44 of the cleaning substrate 45 mounted on the susceptor 18, which is exposed to the chamber 17. The nonwoven cloth 44 is formed of fibers looped around one another in a random fashion, and hence particles 47 that have entered the nonwoven cloth 44 repeatedly reflect diffusely in the nonwoven cloth 44 and then are captured into the nonwoven cloth 44 (FIG. 2B).

Then, as in the case that a wafer W is transferred out from the chamber 17, the cleaning substrate 45 that have captured the particles 47 in the nonwoven cloth 44 is transferred out from the chamber 17 (FIG. 2C), followed by terminating the present process.

According to the cleaning process in FIGS. 2A, 2B, and 2C, the cleaning substrate 45 having the nonwoven cloth 44 is transferred into the chamber 17, and then the interior of the chamber 17 is evacuated to discharge particles in the chamber 17. At this time, the particles 47 that have entered the nonwoven cloth 44 are captured into the nonwoven cloth 44 and removed from the chamber 17. Thus, the particles in the chamber 17 can be efficiently removed. Therefore, the interior of the chamber 17 can be easily cleaned to a desired level, and hence the time period required for maintenance of the chamber 17 can be shortened. As a result, the time period for which the operation of the process module 11 is stopped can be shortened, and hence a decrease in the operating rate of the process module 11 can be prevented.

Figure 3B:
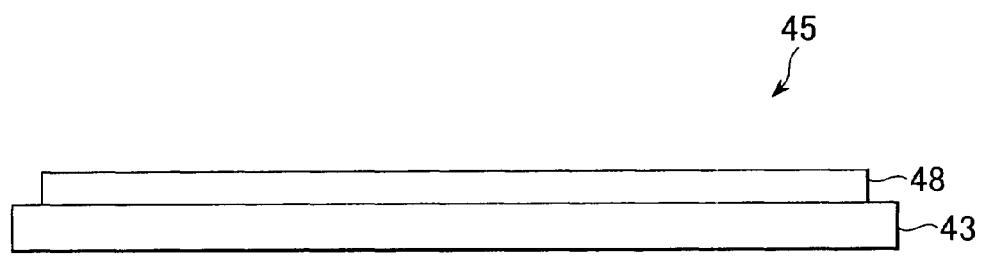
FIG. 3B shows the case that a porous ceramic is provided on the silicon base material.

Although in the cleaning substrate 45 described above, the nonwoven cloth 44 is provided on the silicon base material 43, a porous ceramic 48 may be provided in place of the nonwoven cloth 44 as shown in FIG. 3B. Because the porous ceramic 48 have an infinite number of fine holes formed therein, particles that have entered the porous ceramic 48 are captured into the porous ceramic 48 as is the case with the particles 47. Moreover, because the porous ceramic 48 is plasma-resistant, the interior of the chamber 17 described above may be evacuated and plasma may be produced in the chamber 17 so that particles attached to the wall of the chamber 17 and so on can be separated by electromagnetic stress arising from the produced plasma.

Moreover, the nonwoven cloth 44 and the porous ceramic 48 described above may contain a minute amount of metal. In this case, when the cleaning substrate 45 is mounted on the susceptor 18 and attracted to and held on the electrostatic chuck 27, the metal becomes charged due to a DC voltage applied to the electrostatic electrode plate 26. Because particles charged on the reverse polarity also exist in the chamber 17, it becomes easier to capture the particles into the nonwoven cloth 44 or the porous ceramic 48 due to static electricity acting between the metal and the particles.

Moreover, although in the cleaning substrate 45 described above, the nonwoven cloth 44 or the porous ceramic 48, which is able to capture particles, is provided on the silicon base material 43, an adhesive member may be provided in place of the nonwoven cloth 44 or the porous ceramic 48. Further, although in the cleaning substrate 45 described above, the nonwoven cloth 44 or the like is provided on the silicon base material 43, it may be provided on a glass base material.

Moreover, although in the cleaning substrate 45 described above, the nonwoven cloth 44 or the porous ceramic 48, which is able to capture particles, is provided on the silicon base material 43, that is, on a front surface of the silicon base material 43, the nonwoven cloth 44 or the porous ceramic 48 may be provided on a rear surface of the silicon base material 43. In this case, particles attached to a surface of the susceptor 18 on which the cleaning substrate 45 is mounted, that is, a surface of the susceptor 18 with which the rear surface of the cleaning substrate 45 comes into contact can be captured and removed.

It should be noted that although in the cleaning process in FIGS. 2A, 2B, and 2C, the interior of the chamber 17 is evacuated after the cleaning substrate 45 is transferred into the chamber 17, the chamber 17 may be evacuated first, and the cleaning substrate 45 may be transferred into the chamber 17 in the process of the evacuation. In this case, particles in the chamber 17 can be quickly removed.

Moreover, in the cleaning process in FIGS. 2A, 2B, and 2C, before the cleaning substrate 45 that have captured the particles 47 into the nonwoven cloth 44 is accommodated in the cleaning FOUP 46, a particle removal unit 49 disposed in the transfer chamber 35 of the loader module 13 may remove the particles 47 from the nonwoven cloth 44 as shown in FIG. 4. Specifically, the particle removal unit 49 causes the particles 47 in the nonwoven cloth 44 to become charged, and removes the particles 47 from the nonwoven cloth 44 using static electricity acting between the particle removal unit 49 and the particles 47. In this case, the cleaning substrate 45 can be accommodated again in a substantially new condition in the cleaning FOUP 46, and hence the cleaning substrate 45 can be easily reused.

Moreover, the cleaning FOUP 46 may be provided with a wet cleaning mechanism (not shown) that wet-cleans the accommodated cleaning substrate 45 using pure water. In this case, the particles 47 in the nonwoven cloth 44 can be reliably removed.

Next, a description will be given of variations of the cleaning method according to the embodiment of the present invention.

Figure 5A:
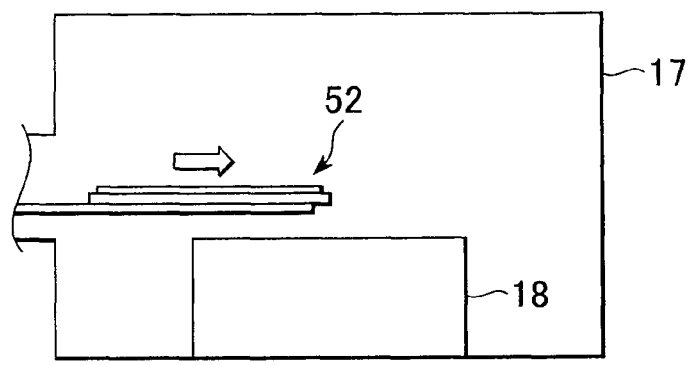
FIGS. 5A, 5B, and 5C are process drawings showing a first variation of the cleaning process as the cleaning method according to the present embodiment.
Figure 5B:
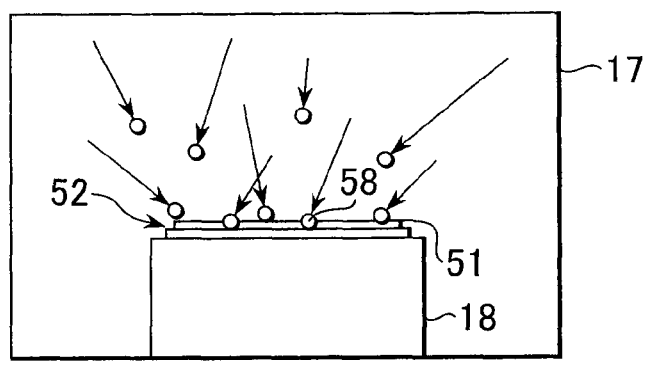
Figure 5C:
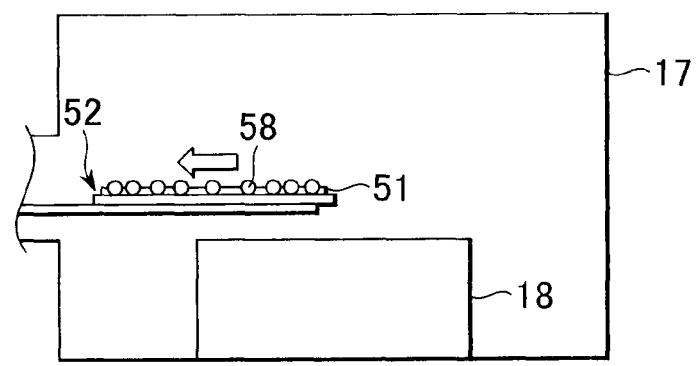

FIGS. 5A, 5B, and 5C are process drawings showing a first variation of the cleaning process as the cleaning method according to the present embodiment.

Figure 7A:
Figure 8:
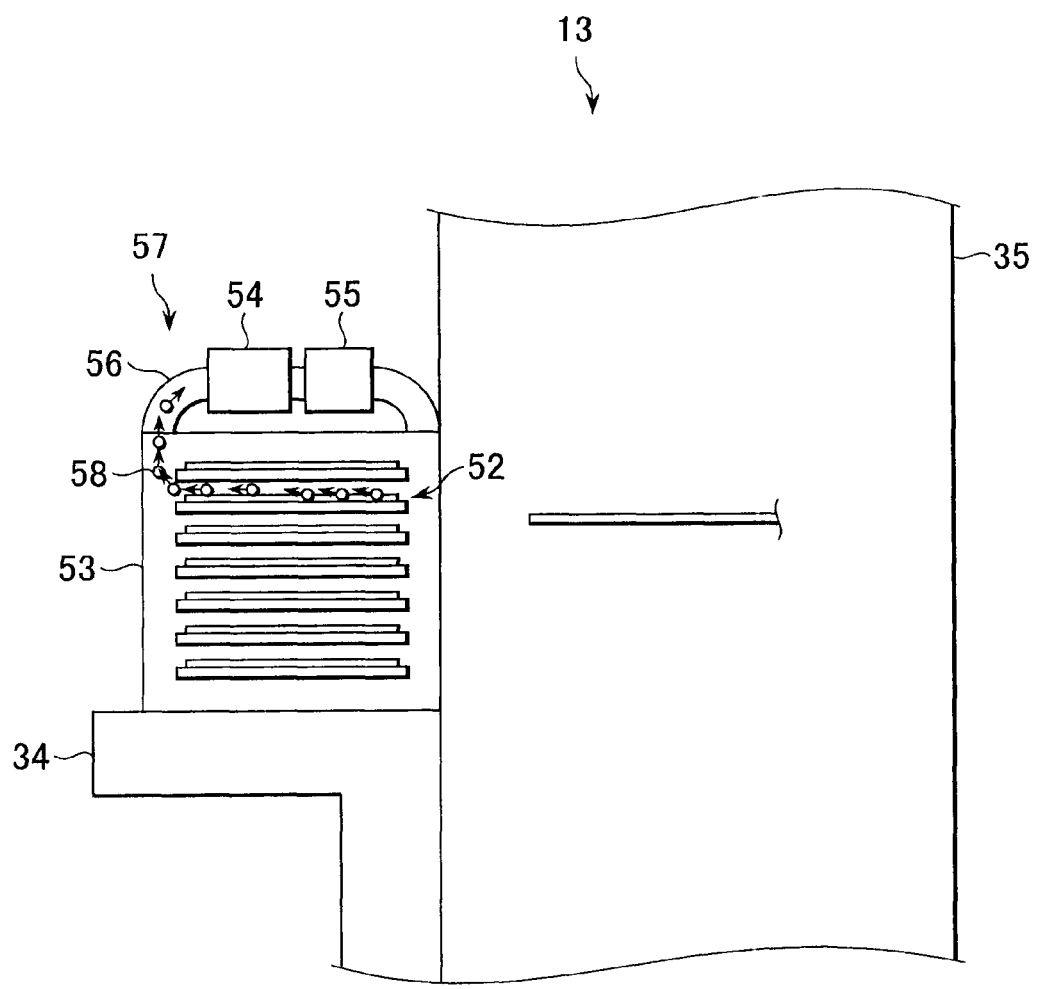
FIG. 8 is a view useful in explaining how moisture absorbed onto the cleaning substrate is removed by a heating/dehumidifying mechanism.

First, before the cleaning process in FIGS. 5A, 5B, and 5C is carried out, cleaning substrates 52 each having a disk-shaped silicon base material 50 and a porous ceramic 51 (moisture absorbing material) provided on the silicon base material 50 as shown in FIG. 7A are prepared. Then, as shown in FIG. 8, a cleaning FOUP 53 in which a plurality of cleaning substrates 52 are accommodated is mounted in place of the FOUP 12 on the FOUP mounting stage 34. The cleaning FOUP 53 is provided with a heating/dehumidifying mechanism 57 that is comprised of a heater/humidifier 54, an air pump 55, and an air vent pipe 56. The temperatures of the cleaning substrates 52 accommodated in the cleaning FOUP 53 are adjusted to a high temperature, for example, 100° C. by air heated by the heating/dehumidifying mechanism 57.

Next, as is distinct from the case that a wafer W is transferred into the chamber 17 of the process module 11, the cleaning substrate 52 is transferred into the chamber 17 and mounted on the susceptor 18 with the temperature of the cleaning substrate 52 being maintained at 100° C. (FIG. 5A).

Subsequently, the exhaust system described above evacuates the interior of the chamber 17. Then, the cleaning substrate 52 is cooled, and the chamber 17 is heated. Specifically, a coolant is supplied into the coolant chamber inside the susceptor 18, and the temperature of the cleaning substrate 52 on the susceptor 18 is controlled to a low temperature, for example, 20° C. through the temperature of the coolant, and the temperature of the chamber 17 is controlled to a high temperature, for example, 60° C. through the temperature of a heater (not shown) buried in a wall or a component part of the chamber 17. At this time, moisture attached to the wall of the chamber 17 and so on gradually evaporates and diffuses in the chamber 17, and part of the moisture as well as gas in the chamber 17 is discharged from the chamber 17. Moreover, part of the moisture comes into contact with the porous ceramic 51 of the cleaning substrate 52 mounted on the susceptor 18, which is exposed to the chamber 17. Because the porous ceramic 51 has water absorbency, the moisture 58 that has come into contact with the porous ceramic 51 is absorbed by the porous ceramic 51 (FIG. 5B).

Then, as in the case that a wafer W is transferred out from the chamber 17, the cleaning substrate 52 of which the porous ceramic 51 has absorbed the moisture 58 is transferred out from the chamber 17 (FIG. 5C), followed by terminating the present process.

According to the cleaning process in FIGS. 5A, 5B, and 5C, after the cleaning substrate 52 having the porous ceramic 51 is transferred into the chamber 17 in a state with the cleaning substrate 52 being maintained at high temperature, the cleaning substrate 52 is cooled, and the chamber 17 is heated. Because the cleaning substrate 52 is transferred at high temperature into the chamber 17, absorption of moisture by the porous ceramic 51 in the path through which the cleaning substrate 52 is transferred into the chamber 17 can be prevented. Moreover, because moisture tends to collect in a low-temperature member, absorption of moisture into the porous ceramic 51 of the cleaning substrate 52 transferred into the chamber 17 is promoted, so that moisture in the chamber 17 can be efficiently removed. As a result, the interior of the chamber 17 can be easily cleaned to a desired level, and hence the same effects as those obtained in the above described cleaning process in FIGS. 2A, 2B, and 2C can be obtained.

It should be noted that in the cleaning process in FIGS. 5A, 5B, and 5C, if the interior of the chamber 17 lies in a vacuum state when the cleaning substrate 52 is transferred into the chamber 17, evacuation is carried out in the chamber 40 of the load-lock module 14. To maintain the cleaning substrate 52 at high temperature, evacuation in the chamber 40 takes time. As a result, the cleaning substrate 52 can be prevented from being rapidly cooled, and the porous ceramic 51 can be prevented from absorbing moisture.

Figure 6A:
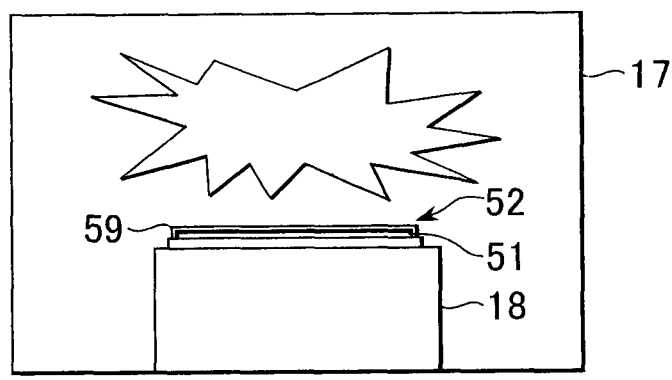
FIGS. 6A an 6B are process drawings showing the case that a porous ceramic of a cleaning substrate is covered with a waterproofing film in the cleaning process in FIGS. 5A, 5B, and 5C.
Figure 6B:
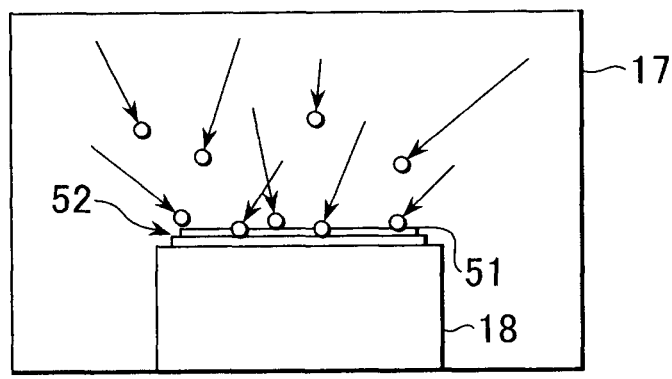
Figure 7B:
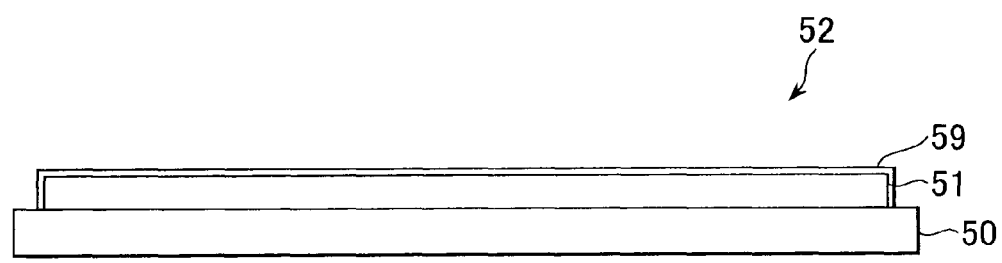
FIG. 7B shows the case that the porous ceramic is covered with a waterproofing film.

Although the cleaning substrate 52 described above has the porous ceramic 51 exposed, the exposed porous ceramic 51 may be covered with a waterproofing film 59 as shown in FIG. 7B. In this case, there is no fear that the porous ceramic 51 will absorb moisture in the path through which the cleaning substrate 52 is transferred into the chamber 17, and hence the necessity to maintain the cleaning substrate 52 at high temperature can be eliminated. It should be noted that because the porous ceramic 51 is covered with the waterproofing film 59, plasma is produced in the chamber 17 as shown in FIG. 6A after the cleaning substrate 52 is transferred into the chamber 17. The waterproofing film 59 is etched by the plasma, and hence the porous ceramic 51 can be exposed to the chamber 17 (FIG. 6B). Further, in the case that plasma is produced in the chamber 17, it is preferred that the plasma is controlled so as to spread to areas in the vicinity of the wall of the chamber 17 and so on. This will make it easier to increase the temperatures of the wall of the chamber 17 and so on.

Moreover, in the cleaning process in FIGS. 5A, 5B, and 5C, after the cleaning substrate 52 of which the porous ceramic 51 has absorbed the moisture 58 is accommodated in the cleaning FOUP 53, the moisture 58 may be removed from the porous ceramic 51 using the heating/dehumidifying mechanism 57 as shown in FIG. 8. Specifically, the heating/dehumidifying mechanism 57 heats/dehumidifies air in the cleaning FOUP 53 to remove the moisture 58 from the porous ceramic 51. In this case, the cleaning substrate 52 that has been used once can be brought into a substantially new condition in the cleaning FOUP 53, and hence the cleaning substrate 52 can be easily reused.

Figure 9A:
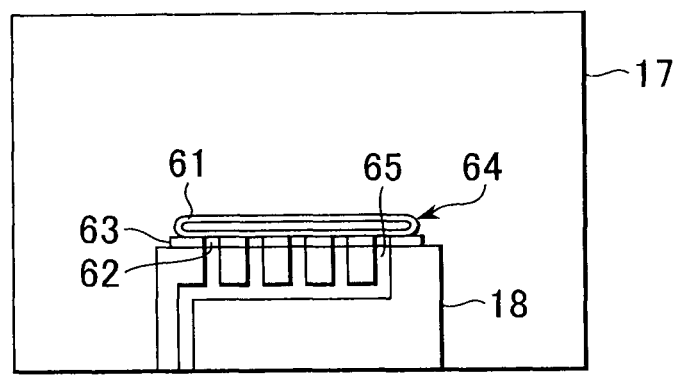
FIGS. 9A and 9B are process drawings showing a second variation of the cleaning process as the cleaning method according to the present embodiment.
Figure 9B:
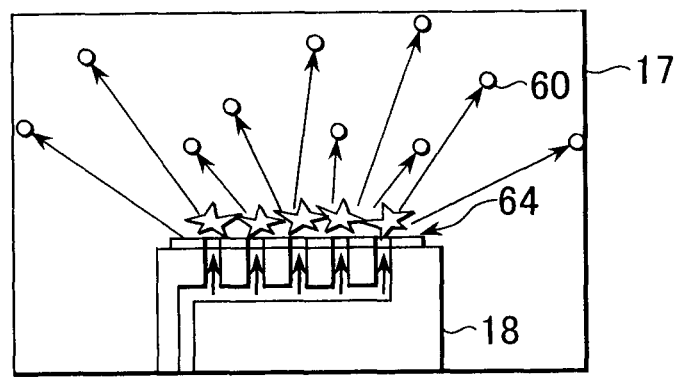

FIGS. 9A and 9B are process drawings showing a second variation of the cleaning process as the cleaning method according to the present embodiment.

Figure 12A:
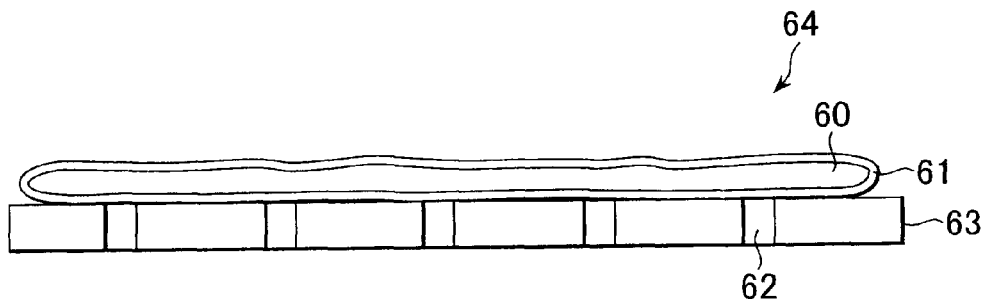

First, before the cleaning process in FIGS. 9A and 9B is carried out, cleaning substrates 64 each having a bag 61 that entirely covers a cleaning agent 60 that cleans deposit in the chamber 17, and a silicon base material 63 that supports the bag 61 thereon and in which a plurality of through holes 62 are formed as shown in FIG. 12A are prepared. Then, a cleaning FOUP (not shown) in which a plurality of cleaning substrates 64 are accommodated is mounted in place of the FOUP 12 on the FOUP mounting stage 34.

Next, as in the case that a wafer W is transferred into the chamber 17 of the process module 11, the cleaning substrate 64 is transferred into the chamber 17, mounted on the susceptor 18, and attracted to and held on the susceptor 18 (FIG. 9A).

Subsequently, the exhaust system described above evacuates the interior of the chamber 17. Then, helium gas is supplied at high pressure into a gap between the cleaning substrate 64 and the susceptor 18. At this time, the pressure of the helium gas is transferred to the bag 61 via the plurality of through holes 62 formed in the silicon base material 63, whereby the bag 61 tears. When the bag 61 tears, the cleaning agent 60 inside the bag 61 scatters into the chamber 17. The cleaning agent 60 that has scattered into the chamber 17 becomes attached to deposit in the chamber 17 and cleans the deposit (FIG. 9B).

Then, as in the case that a wafer W is transferred out from the chamber 17, the cleaning substrate 64 with the bag 61 thereof having ripped is transferred out from the chamber 17, followed by terminating the present process.

According to the cleaning process in FIGS. 9A and 9B, after the cleaning substrate 64 having the bag 61 that entirely covers the cleaning agent 60 that cleans deposit in the chamber 17, and the silicon base material 63 that supports the bag 61 thereon and in which the plurality of through holes 62 are formed is transferred into the chamber 17 and mounted on the susceptor 18, helium gas is supplied at high pressure into the gap between the cleaning substrate 64 and the susceptor 18. At this time, the pressure of the helium gas is transferred to the bag 61, whereby the bag 61 tears, and the cleaning agent 60 inside the bag 61 scatters into the chamber 17. The cleaning agent 60 that has scattered into the chamber 17 becomes attached to deposit in the chamber 17 and cleans the deposit. Thus, the number of times of wet cleaning carried out in the chamber 17 on a regular basis can be decreased. Further, particles arising from deposit in the chamber 17 can be reduced, and hence the time period required for maintenance of the chamber 17 can be shortened, and the same effects as those obtained in the above described cleaning process in FIGS. 2A, 2B, and 2C can be obtained.

Moreover, after the cleaning process in FIGS. 9A and 9B is carried out, the cleaning substrate 64 having the bag 61 that entirely covers a neutralizing agent (not shown) that neutralizes the cleaning agent 60 in place of the cleaning agent 60 may be prepared and transferred into the chamber 17, and the neutralizing agent may be scattered into the chamber 17 as described above. Because there is fear that the cleaning agent 60 that has cleaned deposit in the chamber 17 will remain in the chamber 17, the cleaning agent 60 remaining in the chamber 17 can be neutralized by scattering the neutralizing agent into the chamber 17, and thus deposit in the chamber 17 can be cleaned with safety.

Moreover, it is preferred that the through holes 62 in the silicon base material 63 of the cleaning substrate 64 described above are formed such as to join to transfer gas supply holes 65 opened to an upper surface of the susceptor 18 when the cleaning substrate 64 is mounted on the susceptor 18. In this case, the pressure of helium gas supplied through the heat transfer gas supply holes 65 can be efficiently transferred to the bag 61, whereby the bag 61 can be reliably torn.

Figure 10A:
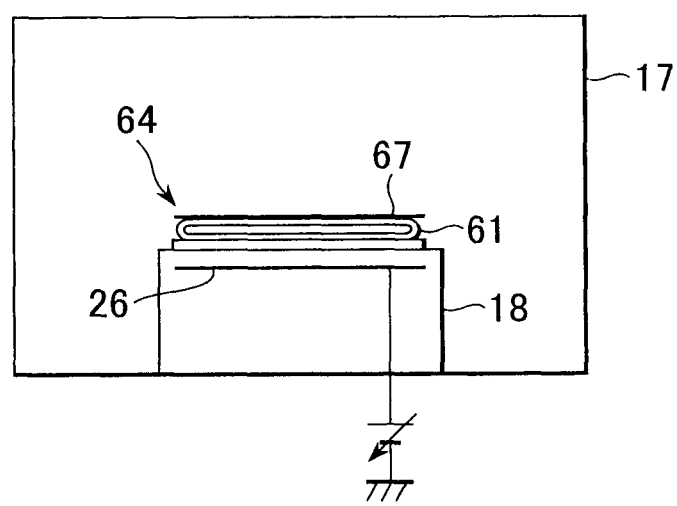
FIGS. 10A and 10B are process drawings showing the case that a metallic thin film is provided as a top covering on a bag instead of forming through holes in a cleaning substrate in the cleaning process in FIGS. 9A and 9B.
Figure 10B:
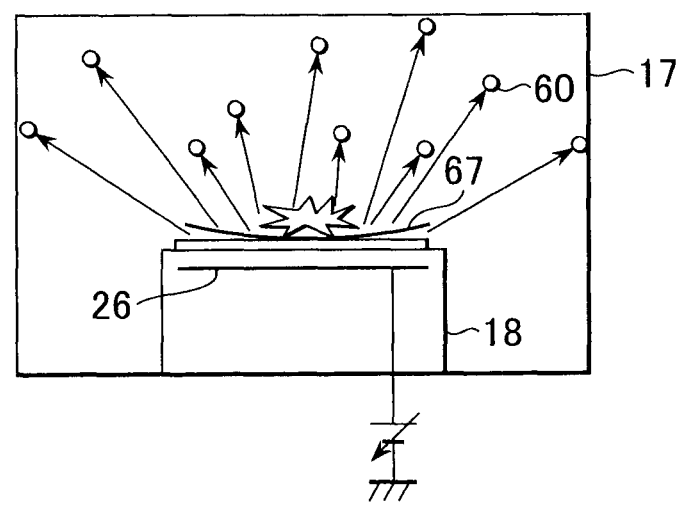
Figure 12B:
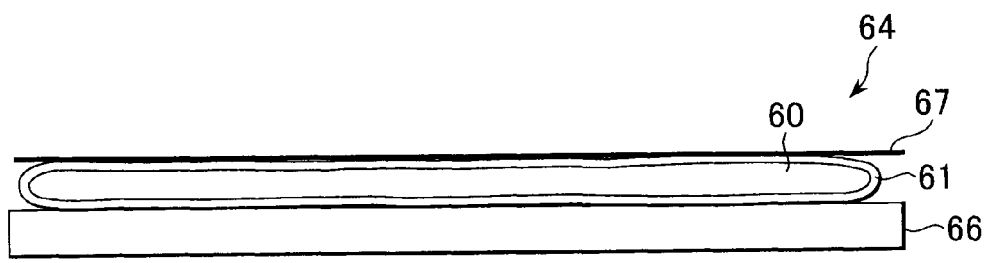

Moreover, although in the cleaning substrate 64 described above, the through holes 62 are formed in the silicon base material 63, the through holes 62 may not be formed, but as shown in FIG. 12B, the bag 61 may be provided on a silicon base material 66, and a metallic thin film 67 may be provided as a top covering on the bag 61. In this case, after the cleaning substrate 64 is transferred into the chamber 17, a DC voltage is applied to the electrostatic electrode plate 26 inside the susceptor 18 as shown in FIG. 10A. At this time, the metallic thin film 67 becomes charged. Thus, static electricity can be produced between the metallic thin film 67 and the electrostatic electrode plate 26, and the bag 61 interposed between the metallic thin film 67 and the susceptor 18 can be torn by pressure arising from the static electricity (FIG. 10B).

Moreover, the bag 61 of the cleaning substrate 64 described above may be made to easily tear by the above described pressure of helium gas and pressure arising from static electricity. Specifically, the bag 61 is formed such as to be thin in portions thereof to which the pressure of helium gas is transferred and portions thereof on which the pressure arising from static electricity acts.

Figure 11A:
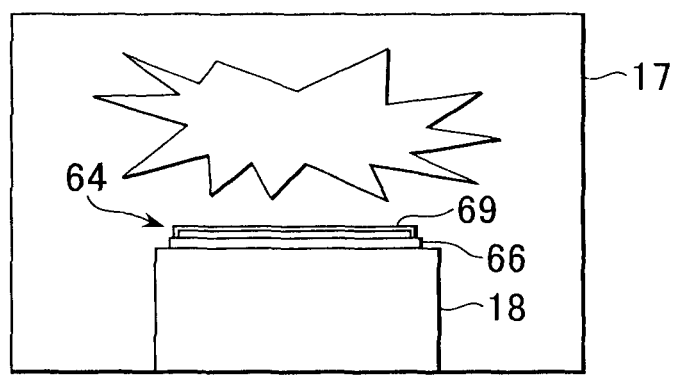
FIGS. 11A and 11B are process drawings showing the case that a cleaning agent is coated on a silicon base material instead of providing a bag that entirely covers a cleaning agent in the cleaning substrate in the cleaning process in FIGS. 9A and 9B.
Figure 11B:
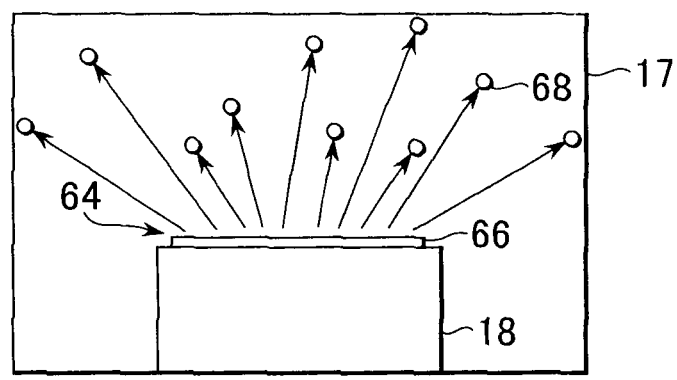
Figure 12C:
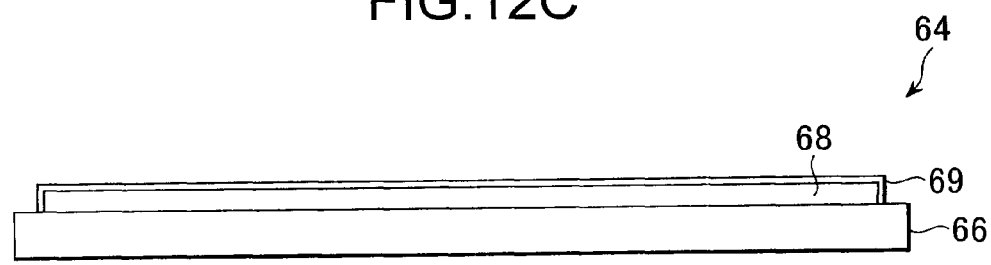

Moreover, although the cleaning substrate 64 described above has the bag 61 that entirely covers the cleaning agent 60, a volatile cleaning agent 68 may be coated on the silicon base material 66, and the cleaning agent 68 may be covered with a resin film 69 as shown in FIG. 12C. In this case, after the cleaning substrate 64 is transferred into the chamber 17, plasma is produced in the chamber 17 as shown in FIG. 11A. The resin film 69 is etched by the plasma, or tears due to heat input from the plasma, the cleaning agent 68 coated on the silicon base material 66 can be scattered into the chamber 17 (FIG. 11B).

It should be noted that a mixture of $NH_4OH$, $H_2O_2$, and $H_2O$ is preferably used as the cleaning agents 60 and 68 in the case that an organic film is attached as deposit to the interior of the chamber 17, a mixture of HCl, $H_2O_2$, and $H_2O$ is preferably used as the cleaning agents 60 and 68 in the case that metal is attached as deposit to the interior of the chamber 17, and HF is preferably used as the cleaning agents 60 and 68 in the case that $SiO_2$ is attached as deposit to the interior of the chamber 17.

Although in the above described embodiment, the substrates subjected to the plasma etching processing are semiconductor wafers, the substrates subjected to the plasma etching processing are not limited to them and rather may instead be any of various glass substrates used in LCDs (Liquid Crystal Displays), FPDs (Flat Panel Displays), or the like.

What is claimed is:

1. A method of cleaning an interior of a processing chamber in a substrate processing apparatus, comprising:
    a transferring-in step of transferring into the processing chamber a cleaning substrate comprising a moisture absorbing material that absorbs moisture attached to an inner wall surface of the processing chamber;
    a temperature adjusting step of heating the processing chamber at a higher temperature than that of the cleaning substrate so that the moisture attached to the inner wall surface evaporates and the cleaning substrate absorbs the evaporated moisture; and
    a transferring-out step of transferring the cleaning substrate out from the processing chamber,
    wherein the cleaning substrate is configured separately from the processing chamber and is capable of being freely transferred-in into and transferred-out from the processing chamber, and
    wherein, in said transferring-in step, the cleaning substrate is mounted on a wafer mounting stage within the processing apparatus.

2. A method of cleaning an interior of a processing chamber in a substrate processing apparatus, comprising:
    a transferring-in step of transferring into the processing chamber a cleaning substrate comprising a moisture absorbing material that is covered with a waterproofing film and absorbs moisture in the processing chamber;
    an etching step of etching the waterproofing film of the transferred-in cleaning substrate;
    a temperature adjusting step of cooling the cleaning substrate and heating the processing chamber; and
    a transferring-out step of transferring the cleaning substrate out from the processing chamber.

3. A cleaning method as claimed in claim 1, comprising a removing step of removing moisture absorbed by the moisture absorbing material of the transferred-out cleaning substrate.

4. A cleaning method as claimed in claim 1, wherein in said transferring-in step, the cleaning substrate is transferred-in into the processing chamber in a state with the cleaning substrate being heated.

* * * * *